United States Patent [19]
Weaver et al.

[11] Patent Number: 5,277,355
[45] Date of Patent: Jan. 11, 1994

[54] SELF-ALIGNING FINE WIRE CLAMP

[75] Inventors: James M. Weaver, Ambler; Frederick W. Kulicke, Jr., Horsham; Eugene W. Frasch, Perkasie; Richard D. Sadler, Quakertown, all of Pa.

[73] Assignee: Kulicke and Soffa Investments, Inc., Wilmington, Del.

[21] Appl. No.: 981,764

[22] Filed: Nov. 25, 1992

[51] Int. Cl.$^5$ .......................................... H01L 21/60
[52] U.S. Cl. ................................................. 228/4.5
[58] Field of Search ...................... 228/4.5, 904, 1.1

[56] References Cited

U.S. PATENT DOCUMENTS

| 4,266,710 | 5/1981 | Bilane et al. | 228/4.5 |
| 4,653,681 | 3/1987 | Dreibelbis et al. | 228/4.5 |

FOREIGN PATENT DOCUMENTS

| 1-261836 | 10/1989 | Japan | 228/904 |
| 2-130844 | 5/1990 | Japan | 228/4.5 |
| 2-301147 | 12/1990 | Japan | 228/904 |
| 3-230539 | 10/1991 | Japan | 228/904 |

Primary Examiner—Mark Rosenbaum
Assistant Examiner—Jeanne M. Elpel
Attorney, Agent, or Firm—John B. Sowell

[57] ABSTRACT

A low mass self-aligning wire clamp jaw assembly is provided which may be employed as a replaceable wire clamp jaw assembly or as a complete integrated wire clamp assembly with an actuator. The novel self-aligning wire clamp jaw assembly comprises a wire clamp jaw mounting arm which is adapted to be connected to a bonding head support. The wire clamp jaw mounting arm serves as a fixed lever to which is attached a first fixed flat surface clamping jaw and also serves as a mount to which a second and pivotal jaw is positioned juxtaposed the first jaw. A force mounting spring is also mounted on the mounting arm for applying a unidirectional force to one end of the second pivotal jaw to bias the pivotal jaw in a normally open or normally closed position. A force adjusting screw is further mounted on the mounting jaw which cooperates with the force spring for setting a predetermined bias jaw force on the second jaw which is mounted for effecting a rocking motion along an edge of the first jaw so that when the second jaw pivots along the line edge of the first jaw, it forms a plane defining a wedge parallel to the first jaw which is self-aligning.

13 Claims, 5 Drawing Sheets

SELF-ALIGNING FINE WIRE CLAMP

BACKGROUND OF THE INVENTION

1. Field of the Invention

The present invention relates to wire clamps for wire bonders and more particularly to an improved wire clamp assembly which is provided with a self-aligning feature for use on existing or new automatic wire bonders.

2. Description of the Prior Art

The present invention is an improvement of the "voice coil actuated fine wire clamp" shown and described in our U.S. Pat. No. 4,653,681 which is assigned to Kulicke & Soffa Industries, Inc., the same assignee as the present invention. Such prior art wire clamps are placed on automatic wire bonders that are capable of producing eight wire bonds every second in a preferred bonding mode. The wire clamps open and close once for every wire bond. It is not unusual for such wire bonders to be operated over 70 to 75% of the time when used continuously over more than one full production shift. This implies that one-quarter billion movements of the actuating levers of the wire clamps take place over one year on one shift alone. The jaws of the prior art wire clamps were designed to close and clamp a wire while having the clamping faces of the jaws actuated in substantial parallel alignment. The moving part of the wire clamps were pivoted on pivot bearings which may be lubricated, however, the jaw of the wire clamps are not lubricated and are subject to wear and require replacement.

Worn prior art wire clamps must be replaced before they cease to function properly and cause damage to valuable semiconductor product. It is extremely difficult to inspect the prior art wire clamp jaws to determine whether they are becoming inoperable. Once the jaws of the prior art wire clamps become inoperable, production is interrupted and if the wire bonder is part of an integrated production line of equipment, the whole line is usually interrupted or at least delayed.

There are basically two types of wire clamps from the service and maintenance point of view. Wire clamps that are provided with replaceable jaw elements are mounted on supporting structural elements. When the jaws of such wire clamps become inoperable, the wire bonder is stopped and the worn jaws are removed. The new jaws are attached to the wire clamp system and then the maintenance engineer must physically measure the clearance between the jaw elements and also attempt to physically bend and align the jaw support elements. This latter task is sheer guess work for there is no known way to visually measure parallelism between jaws of wire clamps without special calibration tools. Usually the replaceable jaws replacement period is predicated on a preventive maintenance schedule.

Wire clamps are assumed to be parts which wear out and are replaced after a predetermined number of hours. The wire clamp assembly shown in U.S. Pat. No. 4,653,681 are mounted on a bond head link or bracket and are detachable from the wire bonder and replaced as a unit. When the jaws are made of very hard material such as synthetic jewels, the maintenance-replacement period is so long that it can be scheduled to occur during a scheduled down time and the wire bonder does not cause rejected product or interruption of the integrated production line. While this latter type of service maintenance is not only more cost efficient, it avoids the possible destruction of valuable integrated circuit devices that were otherwise perfectly acceptable if not abused in an automatic wire bonder which is not in proper adjustment.

It would be desirable to provide a wire clamp assembly that embodies all the desirable and reliable features of the detachable wire clamp system as the type shown in U.S. Pat. No. 4,653,681 and would also permit rapid and accurate replacement of the jaws without replacement of the wire clamp system and without the need for a highly skilled technician or even the need for precision instruments to make critical adjustments.

SUMMARY OF THE INVENTION

It is a primary object of the present invention to provide a novel fine wire clamp for operation at continuous high speeds without the need for adjustment.

It is another primary object of the present invention to provide a novel wire clamp assembly for mounting on a wire clamp system that is factory specification adjusted as a result of being attached to the wire clamp system.

It is another primary object of the present invention to provide a novel wire clamp assembly which may be rapidly detached, cleaned and inspected and replaced in a wire clamp system ready for operation without the need for physical change or field adjustments.

It is yet another primary object of the present invention to provide a novel wire clamp assembly which may be disassembled and reassembled in the field after being manufactured and reinstalled on a wire clamp system ready for operation after minor adjustments.

It is another principal object of the present invention to provide an inexpensive wire clamp assembly which has a self-aligning jaw mechanism.

It is another principal object of the present invention to provide a removable wire clamp assembly which may easily be inspected.

It is another primary object of the present invention to provide a novel wire clamp assembly which embodies replaceable wire clamp jaws.

It is another principal object of the present invention to provide a novel wire clamp assembly which is provided with a novel removable wire clamp jaw assembly.

It is another object of the present invention to provide a novel wire clamp assembly having a novel mode of operation which assures self-adjustment parallelism of the wire clamp jaws within hundreds of a thousandth of an inch.

It is another object of the present invention to provide a novel wire clamp assembly having a pair of flat faced jaws wherein one jaw is mounted for pivoting action on the other jaw, thus assuring incremental line surface parallelism.

It is another object of the present invention to provide a novel spring support mechanism for a novel wire clamp jaw assembly which assures the minimum amount of scrub between the pivoting action of the jaws.

It is another general object of the present invention to provide a novel wire clamp assembly having an adjustable wire clamping force system which is decoupled from the jaw actuation mechanism and decoupled from inertia forces when operating a high inertia speeds.

It is another general object of the present invention to provide a novel wire clamp assembly which is economical to build and remains reliable over its entire working life.

According to these and other objects of the present invention, there is provided an improved wire clamp jaw assembly for mounting on a wire clamp system which comprises an assembly mounting arm which mounts on the bonding head of an automatic wire bonder with a single screw attachment. The assembly mounting arm serves as a support and guide for a fine wire feed tube and has a fixed jewel mounted thereon. A second jewel is mounted on a flexible spring which is mounted on a pedestal extension of the assembly mounting arm which further provides support for a force adjustment spring which bears on the movable or pivotal jewel.

DESCRIPTION OF THE PREFERRED EMBODIMENT

Figure 1:
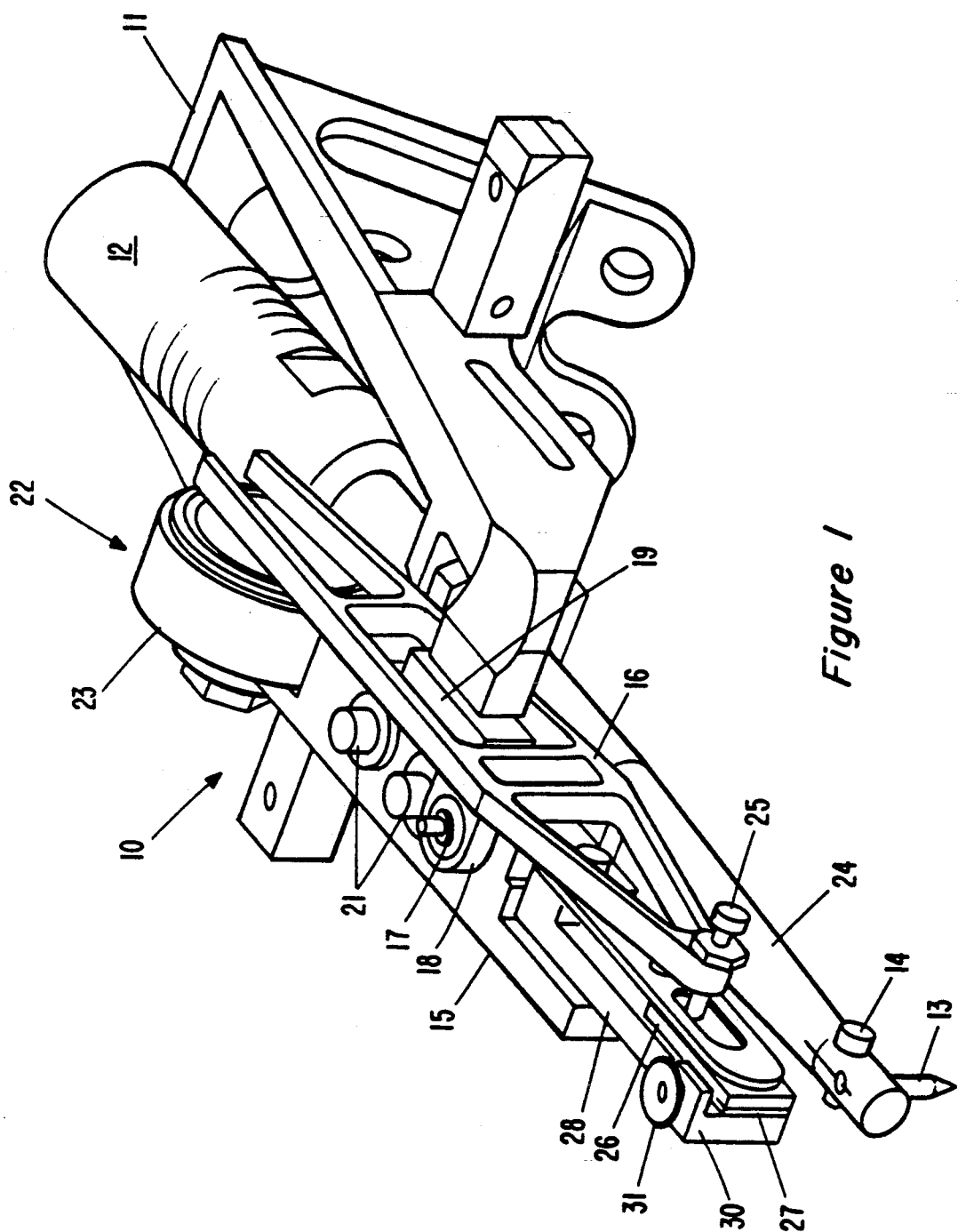
FIG. 1 is an enlarged isometric view showing the present invention wire clamp mounted on a bonding head link of an automatic wire bonder.

Refer now to FIG. 1 showing an enlarged isometric view of a preferred embodiment wire clamp 10 mounted on a bond head link 11 which also supports a transducer 12 having a bonding capillary 13 mounted in aperture in the end of the transducer horn. The bond head link 11 is adapted to pivot on an axis (not shown) to impart a vertical or Z-motion to the bonding tool 13 which is clamped in the end of the transducer 12 by a clamp screw. The wire clamp 10 comprises a first fixed lever 15 which pivotally supports a movable lever 16 mounted for movement on lever 15 through a bearing shaft 17 having roller bearings mounted in protrusions of ears 18 extending from the movable lever 16. The whole wire clamp assembly is mounted on the bond head link 11 via a theta adapter 19 and a pair of cap screws 21 which extend through the top of the fixed lever 15 and threadably are attached to the theta adapter 19. The movable lever 16 is actuated by a voice coil assembly 22 cooperating with a magnet assembly 23 attached to the fixed lever 15.

The voice coil assembly 22 is adapted to apply a force at the force end of the lever 16 to actuate the adjustable push rod assembly 24. The adjustment screw 25 is adapted to a apply an actuating force to the back of the movable jaw 26 that rocks or pivots on the fixed jaw 27 which is fixedly mounted on the assembly mounting arm 28.

Figure 2:
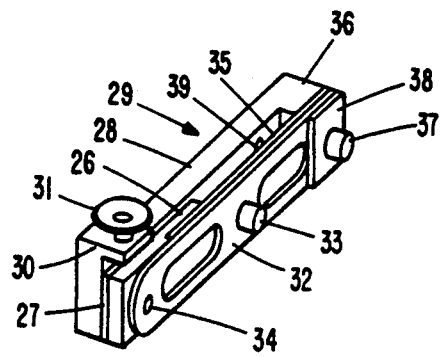
FIG. 2 is an enlarged isometric view of the novel wire clamp jaw assembly which mounts on the wire clamp assembly.

Refer to FIG. 2 showing the wire clamp jaw assembly 29 removed from the wire clamp 10. The assembly mounting arm 28 is provided with an L shaped extension having a glass feed tube 31 mounted therein which is provided with a central aperture that guides a fine wire to a position where it is guided directly onto the fixed jaw 27 for being clamped and held by the movable or pivotal jaw 26. The wire clamp jaw assembly 29 comprises a force spring 32 provided with adjustable force means shown as a cap screw 33 which is threadably attached to the assembly mounting arm 28. A dimple or raised surface 34 is provided at the end of the force spring 32 which bears upon the rear surface of the movable or pivotal jaw 26 either directly or through the movable jaw pivot spring 35. The springs 32 and 35 are mounted on a extension or pedestal 36 of the arm 28 and are held by a cap screw 37 and clamping plate 38. A threaded aperture 39 is provided through the back of the assembly mounting arm 28 for attaching the assembly to the fixed arm 15.

Figure 3:
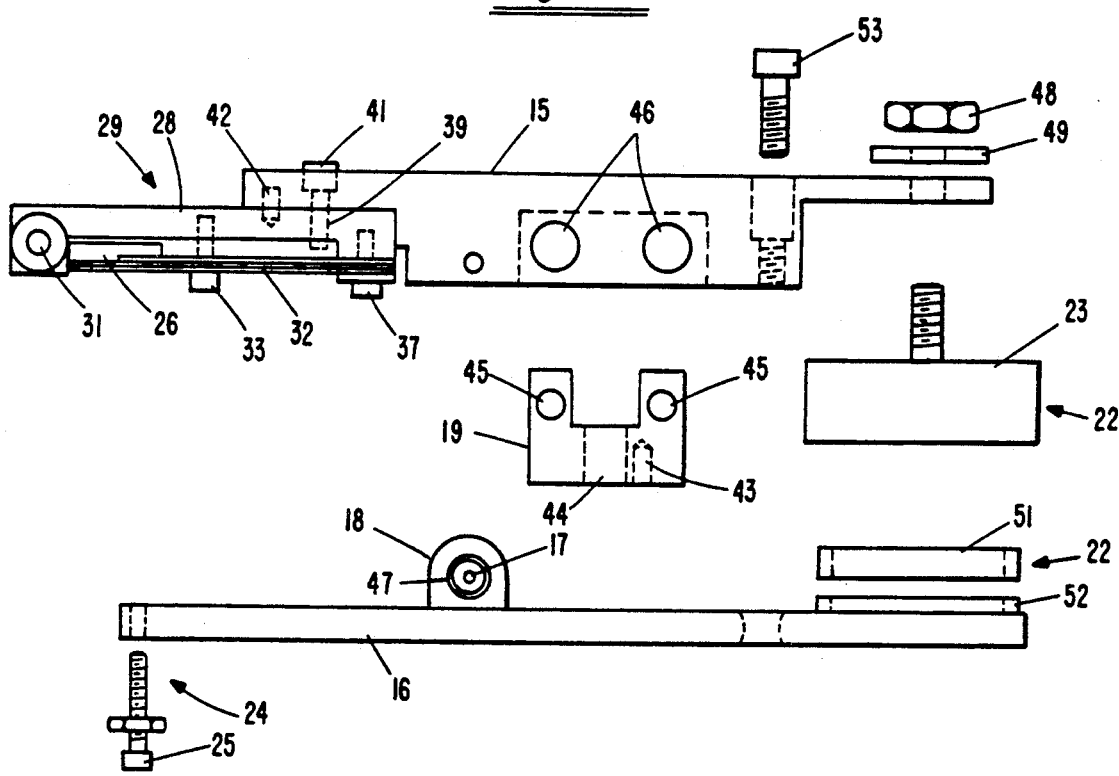
FIG. 3 is an enlarged exploded top view of the parts of the present invention wire clamp system shown in FIG. 1.

Refer now to FIG. 3 showing an enlarged exploded top view of the parts of the present invention wire clamp system which is attachable to the link 11 shown in FIG. 1. The wire clamp jaw assembly 29 is shown attached to the fixed lever arm 15 by a cap screw 41 screwed into threaded aperture 39. Precise alignment is provided by pilot pin 42 which is preferably mounted in the fixed arm 15 for piloting into an aperture of the assembly arm 28. The theta adapter 19 is shown having a pilot hole 43 which engages a pin (not shown) extending from the link 11. In the preferred embodiment shown, the theta adapter 19 is first attached to the link 11 by a cap screw (not shown) that is fitted through the aperture 44. The theta adapter is provided with a pair of threaded apertures 45 which are engagable by the cap screws 21 which extend through the oversize apertures 46, thus, providing theta adjustment of the novel clamp assembly 29. The movable arm 16 has a pair of protrusions 18 into which are fitted miniature ball bearings 47 which support the aforementioned bearing shaft 17. The magnet assembly 23 is preferably attached by means of a nut 48 and washer 49 to the fixed arm 15. The movable coil 51 is fixably mounted on the movable arm 16 by means of adhesives and a pedestal support 52. The movable arm is normally positioned for optimum electromagnetic force of the voice coil assembly by means an adjustment screw 53 which bears on a rib on movable arm 16. After the optimum electromagnetic force is set using adjustment screw 53, the adjustable push rod screw 25 is then adjusted and locked into position on movable arm 16 and requires no further adjustment during normal operations.

Figure 4:
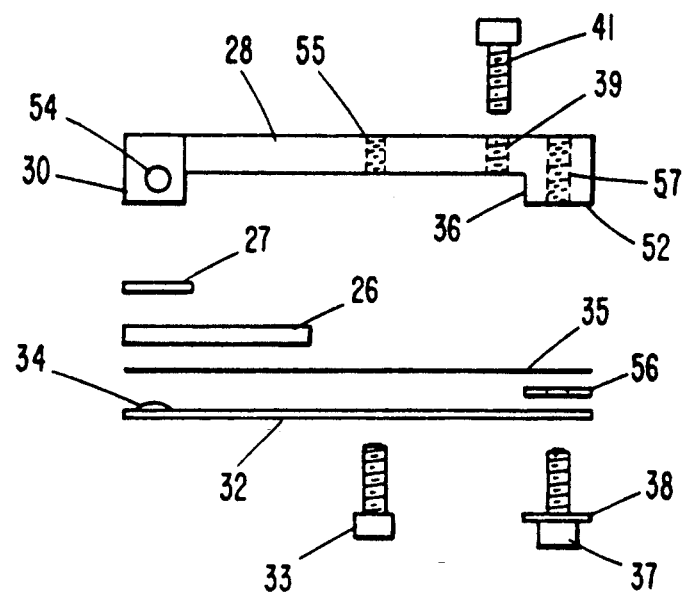
FIG. 4 is an enlarged exploded top view of the parts of the present invention wire clamp jaw assembly.

Refer now to FIG. 4 showing an enlarged top view of the parts of the present invention wire clamp jaw assembly. Most of the parts of FIG. 4 have already been explained and employ the same numbers as those employed in FIGS. 1, 2 and 3 hereinbefore and do not require additional explanation. An aperture 54 in the L-shaped arm 30 is adapted to receive the feed tube 31 (not shown). A threaded aperture 55 is provided in the arm 28 to receive the cap screw 33 which applies force to the force spring 32 which applies via dimple 34 a force on the movable jaw 26. A spacer 56 is provided between springs 32 and 35 to position the springs in parallel alignment to each other. Screw 37 holds parts 38, 32, 56 and 35 on pedestal support 52 when fitted in aperture 57. In the preferred embodiment of the present invention, pivot spring 35 is a thin spring which is attached by adhesives to the back of movable jaw 26 which forms a bearing plate for the adjustable push rod screw 25.

Figure 5:
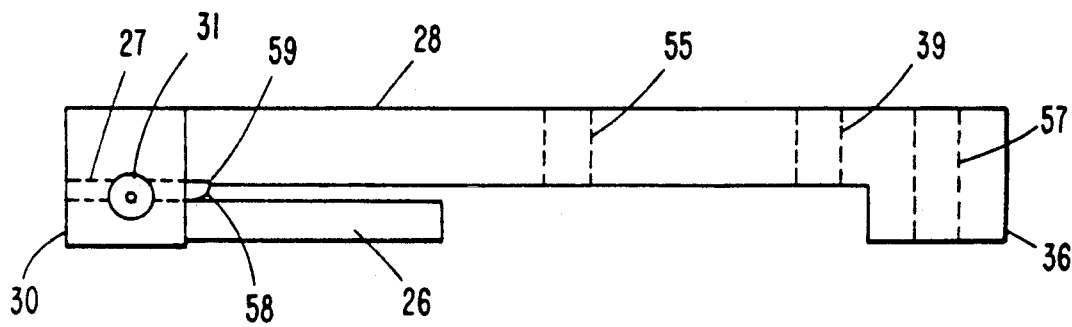
FIG. 5 is a schematic drawing in top view of the jaws of the jaw assembly of FIG. 4 when the wire clamp jaws are normally spring biased closed.
Figure 6:
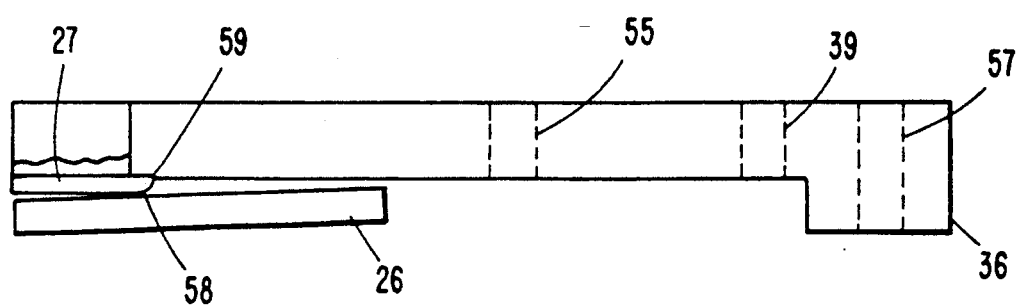
FIG. 6 is a schematic drawing in top view of the jaws of the jaw assembly when the wire clamp jaws are actuated full open.

Refer now to FIGS. 5 and 6 showing schematic drawings in top view of the jaws of the jaw assembly in their normally closed spring bias position and in their fully actuated open positions respectively. When the jaws 26 and 27 are flush against each other as shown in FIG. 5, a wire cannot be placed between the jaws. However when jaw 26 is rocked on the rounded or bevel portion 58 of the end of jaw 27, the aperture 54 and feed tube 31 are properly aligned with the opening and a fine wire is threadable between the jaws. In order to assure that the pivot radius 58 is aligned parallel to the normal axis of the fine wire, a notch 59 is provided in the assembly mounting arm 28 for ease of assembly which assures proper alignment.

Figure 7:
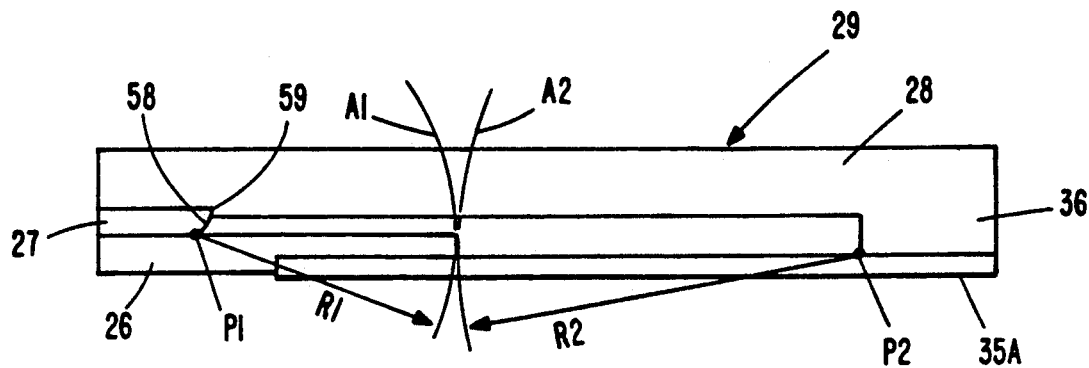
FIG. 7 is a schematic drawing in top view of the jaws of the jaw assembly showing the pivot points of a modified spring support.

Refer now to FIG. 7 showing a schematic drawing in top view of the jaws of the jaw assembly 29 which comprises the mounting arm 28 having a pedestal 36 on to which is mounted a modified pivot spring 35A. The pivot spring 35A will pivot at pivot point P2 on a radius R2 where the spring 35A flexes at its connection to movable jaw 26. Similarly, the movable jaw 26 pivots about pivot point P1 forming a flex radius R1. Thus the spring 35A is being flexed in two different directions as the movable jaw 26 pivots about its pivot points P1 and P2. The pivot spring 35A is placed on the outside of the movable jaw 26 and the pedestal 36 is arranged so that the pivot point P2 is higher than the pivot point P1. The arcuate movement of the spring 35A, shown by the motion paths A1 and A2 will coincide with each other. However, the arcuate paths will extend from the axis of the overlap points by an amount equal to approximately one-10,000ths of one inch. Thus, when the initial pivoting actual action takes place, the horizontal length of the spring foreshortens, causing a slight scrubbing action about the radius 58. This scrubbing action may be minimized by changing the ratios of the radii R1 and R2 and their pivot points P1 and P2. There is no preferred mathematical formula for accomplishing this since the compactness of the assembly 29 takes precedence for fitting it into the wire clamp jaws.

Having explained a preferred embodiment of the present invention and two modifications of the pivot springs 35, it will be understood that the simplest and most economical way to generate a pivot for the movable jaw 26 is to mount the jaw 26 on a linear flat flexible spring 35 and then design the scrubbing action so that the overlap of the arcuate paths A1 and A2 do not exceed one-10,000ths of an inch which has been accomplished in the present embodiments.

Figure 8:
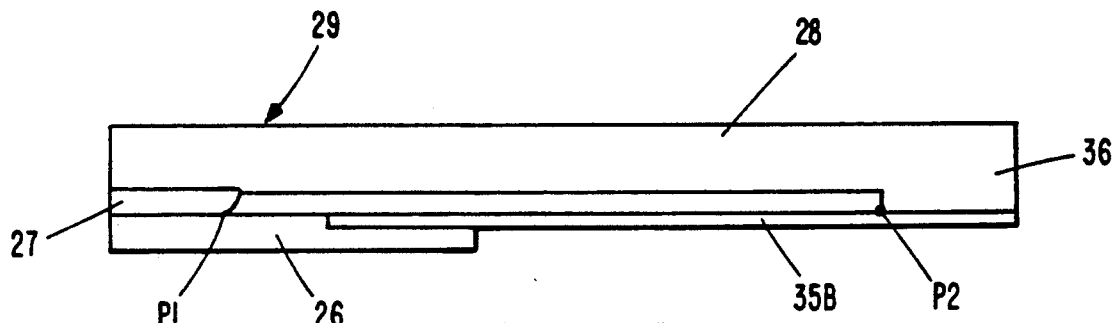
FIG. 8 is a schematic drawing in top view of the jaws of the jaw assembly showing the pivot points of another modified spring support.

Refer now to FIG. 8 which is a schematic drawing of a top view of the jaws of a jaw assembly showing the pivot points P1 and P2 employing another modified spring support 35B. The amount of scrub incurred in the FIG. 4 preferred embodiment is greater than the amount of scrub which is incurred in the FIG. 7 embodiment. However, the amount of scrub which occurs in the FIG. 8 embodiment is even less than the amount of scrub which occurs in the FIG. 7 embodiment. In the FIG. 8 embodiment, the fixed jewel 27 is made from a very hard carbide and is 24/1,000ths inch thick. The movable jewel 26 is made from a very hard synthetic sapphire and is 50/1,000ths inch thick. The pivot spring 35B is made from spring steel and is apertured to receive the different screws described herein before and is 3/1,000ths inch thick. The offset of the pivot points P1 and P2 for minimum scrub was 8/1,000ths of an inch in the vertical direction. These dimensions will change slightly with the length of the assembly arm 28 and the length of the movable jaw 26 which are the factors to be taken into consideration when designing for minimum scrub.

Having explained a preferred embodiment and the preferred modifications for the pivot springs 35, it will be understood that other modifications can be made for creating a negative scrub which moves the movable jaw 26 to the right during initial pivoting movement or can be designed so that a positive scrub is encountered which extends the movable jaw 26 to the left.

Figure 9:
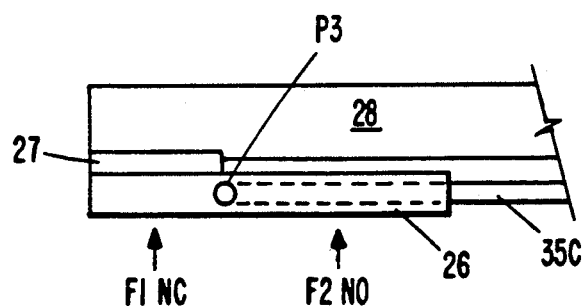
FIG. 9 is a schematic drawing in top view of the jaws of a jaw assembly illustrating two different modes of operation.

Refer now to FIG. 9 showing a schematic drawing in top view of the jaws of a jaw assembly illustrating two different modes of operation. In a first mode of operation, the jaws 26 and 27 may be biased normally closed by applying a force F1 onto the back of movable jaw 26 and to effect opening actuation a force F2 is applied by an actuator (not shown). In a second mode of operation, the force F2 is applied so that the jaws 26 and 27 are normally open and to effect closing actuation or clamping, a second force F1 is applied by the actuator.

A pivot point P3 is shown provided on the movable jewel jaw 26 which will result in the same mode of operation described hereinbefore with reference to FIGS. 1 to 8. In this preferred embodiment, a support spring 35C is provided with pivot stub shafts (not shown) which operate in the recess of the jewel at point P3 to effect pivoting or rocking motion. The same rocking motion may be provided by modifying pivot P3 to provide a groove across movable jewel 26 which cooperates with a cylindrical pivot shaft provided on the end, or at the end of the fixed jewel 27. Thus, FIG. 9 illustrates the placement of the pivot points P1 to P3 explained hereinbefore which provide a rocking motion of the movable jewel 26 at a pivot point at the end of the fixed jewel 27 which causes the jaws 26 and 27 to be self-aligning.

Figure 10:
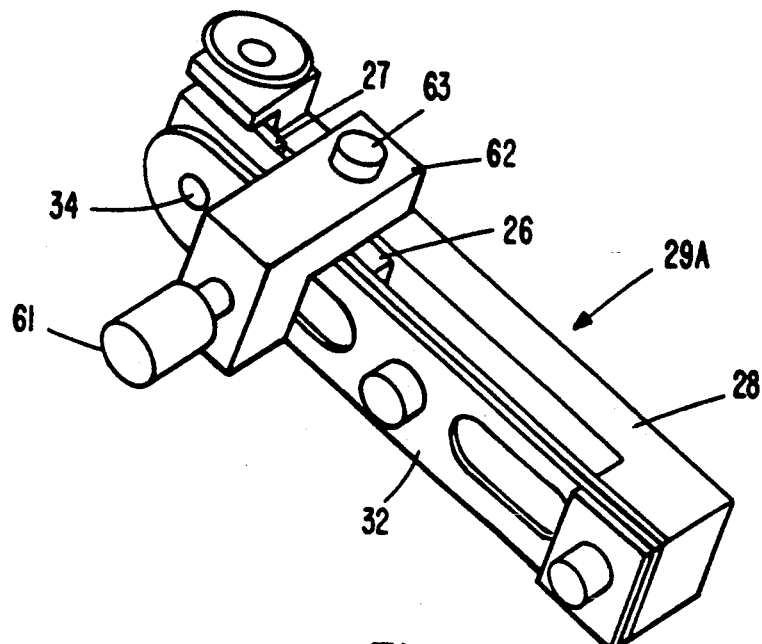
FIG. 10 is a schematic drawing of another preferred embodiment jaw assembly adapted to operate as a wire clamp assembly.

Refer now FIG. 10 showing a schematic drawing of another preferred embodiment jaw assembly adapted to operate as an integrated wire clamp assembly. The spring 32 is shown biased to apply the aforementioned F1 force and to effect a normally closed force on the jaws 26 and 27 as had been described hereinbefore. However, the voice coil assembly 22 described with reference to FIG. 1 and the levers 15 and 16 has been eliminated. The assembly 29A is now preferably attached directly to an extension arm of the link 11. A miniature electromechanical actuator 61 is supported by an L-shaped bracket 62 which is mounted on assembly mounting arm 28 by a removable cap screw 63. It will be recognized that when the assembly 29A is attached in place of the assembly 29 shown in FIG. 1 that the assembly 29A becomes a completely integrated wire clamp assembly as distinguished from a wire clamp jaw assembly. Miniature actuator 61 will apply a force F2 to effect opening of the jaws 26, 27.

Figure 11:
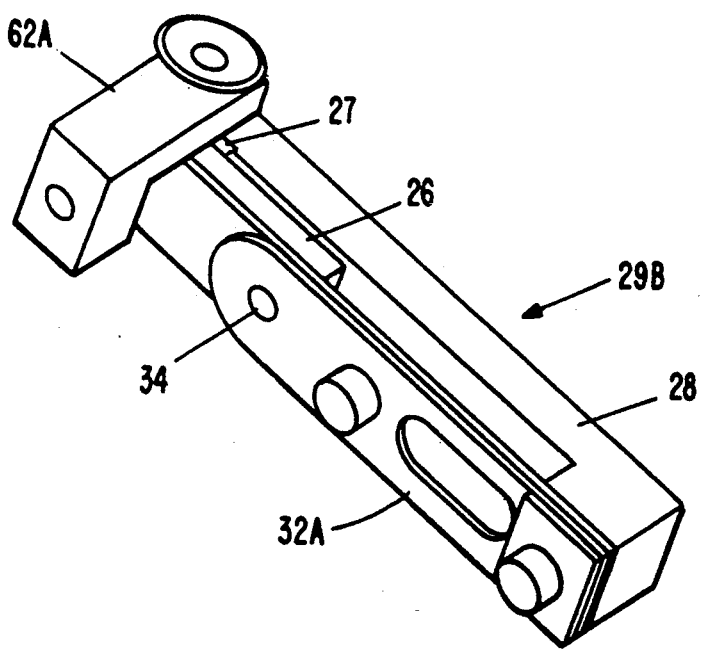
FIG. 11 is a schematic drawing of another preferred embodiment jaw assembly adapted to operate as a wire clamp assembly.

Refer now to FIG. 11 showing a schematic diagram of another preferred embodiment jaw assembly, adapted to operate as integral wire clamp assembly 29B. In this embodiment, the spring 32A is foreshortened and adapted to apply a force F2 to the extended end of movable jaw 26 to effect actuation of the jaws 26 and 27 and the actuator (not shown) similar to actuator 61 applies a force F1 to effect closing of the normally open jaws 26 and 27.

Having explained the preferred mode of operation it can be understood that a movable jaw rocks or pivots on or about an edge of a fixed jaw 27 of the jaws which form a parallel plane wedge therebetween when acting as a wire clamp on a fine wire threaded between the jaws 26 and 27. Having explained normally open and normally closed jaws within the concept of a jaw assembly 29, it will be understood that the jaw assembly 29A, 29B having an actuator 61 may completely replace the prior art wire clamp actuator 22 shown in FIG. 1 when the novel assembly 29 is applied to newly produced wire bonders. Further, the novel wire clamp jaw assembly 29A and 29B may also be retrofitted to thousands of automatic wire bonders which have been sold all over the world and are still viable production machines Thus, the present invention may be viewed as an enhancement to new machines and as a retrofit or partial retrofit to existing machines. In both environments, the novel and desirable rocking mode of operation provides self-alignment and rapid jaw replacement in the field.

The actuators shown in FIGS. 10 and 11 may be physically placed on the link mechanism 11 and connected by rods or levers or flexible actuating shafts to effect the forces F1 and F2 described hereinbefore.

A feature of the present invention is that the wire clamp jaw assembly 29 may be removed from any of the aforementioned embodiments by removing a single screw 41 and attaching a new preadjusted wire clamp jaw assembly 29 to a link 11 and resume production in less than five minutes. Even when a wire size change is made, and the adjustment screw 25 is reset for a different size of wire, the complete changeover is still accomplished in less than ten minutes, thus effecting enormous savings of production in the field. An assembly 19 may be removed at a routine preventive maintenance period. It also may be disassembled and cleaned and reassembled after examining the wearing parts to determine if the cleaned assembly 29 is production worthy until the next routine maintenance period. Thus, it will be understood that the novel wire clamp jaw assembly has several different advantages over prior art wire clamp assemblies. First, the simple and reliable structure may be manufactured at a price lower enough to justify its classification as a dispensable wearing part. Secondly, the assembly 29 effectively replaces the larger and more massive actuating levers 15 and 16 in a wire clamp system of the type shown and described in U.S. Pat. No. 4,635,681 (and used by manufacturers of automatic wire bonders) to reduce inertia forces and increase speed and reliability.

It is possible to replace a major portion of link 11 with an arm and theta adapter 19 on which the jaw assembly 29 is mounted and have a complete wire clamp system. The most important feature is the fact that the assembly 29 can be completely removed as an integral unit from a production wire bonder and a similar assembly 29 mounted on the same support bracket so that the wire bonder is immediately placed back into an operating condition incurring the minimum of down time. Lastly, another feature is that the jewels 26 and 27 may be made of different materials for use with different size wires and/or wires of different materials. When such special wire clamps are made it is very easy to rapidly replace the wire clamp jaw assembly (wire clamp system) on a wire bonder with the minimum of down time.

What is claimed is:

1. A self-aligning wire clamp jaw assembly, comprising:
   a jaw mounting arm,
   means for precisely attaching said jaw mounting arm to a bonding head of a wire bonder,
   first jaw means fixed onto a flat surface of said jaw mounting arm,
   second jaw means,
   means for supportably mounting said second jaw means on said jaw mounting arm,
   force spring means supportably mounted on said jaw mounting arm for biasing said first and second jaw means into a normally open or normally closed position by application of a bias force on said second jaw means,
   force adjustment means mounted on said jaw mounting arm and coupled to said force spring means for setting said predetermined bias force, and
   pivot means on one of said jaw means for effecting a rocking motion of said second jaw means along a line edge of said first jaw means, whereby said second jaw means is pivoted as a plane relative to said first jaw means forming an adjustable wedge with to said first jaw means when actuated by an actuation force.

2. A self-aligning wire clamp jaw assembly as set forth in claim 1 which further includes actuator means mounted on said jaw mounting arm and cooperating with said second jaw means for effecting jaw clamping motions.

3. A self-aligning wire clamp assembly as set forth in claim 2 wherein said actuator means comprises an electro mechanical actuator.

4. A self-aligning wire clamp assembly as set, forth in claim 3 wherein said electro mechanical actuator is located remote from said jaw mounting arm.

5. A self-aligning wire clamp assembly as set forth in claim 1 wherein said pivot means comprises a rounded edge on said first jaw means that is substantially parallel to vertical axis and the path of a fine wire to be clamped between said jaw means.

6. A self-aligning wire clamp assembly as set forth in claim 1 wherein said means for supportable mounting said second jaw means comprises a thin flexible spring connected to said second jaw means and adapted to flex about two pivot points.

7. A self-aligning wire clamp assembly as set forth in claim 1 wherein said means for supportable mounting said second jaw means comprises pivot shaft means for pivotally supporting said second jaw means about a pivot axis parallel to the edge of first jaw means.

8. A self-aligning wire clamp assembly as set forth in claim 1 wherein said first jaw means is provided with cylindrical pivot means along one edge and said second jaw means is provided with cooperating surface means pivoting on said cylindrical pivot means.

9. A self-aligning wire clamp assembly as set forth in claim 8 wherein said cylindrical pivot means and said cooperating surface means comprise coaxial cylinders.

10. A self-aligning wire clamp assembly as set forth in claim 1 wherein said force spring means comprises a thin flexible spring mounted on a fixed support at one end of said jaw mounting arm opposite said first jaw means as a cantilevered lever and having its free end engagable with second jaw means to apply said bias force.

11. A self-aligning wire clamp assembly as set forth in claim 10 which further includes a hemispherical shape protrusion for applying a unidirectional bias force to said second jaw means to effect a normally open or normally closed position.

12. A self-aligning wire clamp assembly as set forth in claim 1 which further includes a theta adapter connectable between said mounting arm and said wire bonder for positioning said wire clamp jaw assembly in a rotational or theta direction.

13. A self-aligning wire clamp assembly as set forth in claim 12 wherein said theta adapter comprises a bond head link for mounting said wire clamp jaw assembly directly to a bonding head of a wire bonder.

* * * * *